(12) United States Patent
Chen et al.

(10) Patent No.: US 12,119,275 B2
(45) Date of Patent: Oct. 15, 2024

(54) RECESSED LID AND RING DESIGNS AND LID LOCAL PERIPHERAL REINFORCEMENT DESIGNS

(71) Applicant: Apple Inc., Cupertino, CA (US)

(72) Inventors: Wei Chen, San Jose, CA (US); Jie-Hua Zhao, Cupertino, CA (US); Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 281 days.

(21) Appl. No.: 17/461,207

(22) Filed: Aug. 30, 2021

(65) Prior Publication Data

US 2023/0062454 A1  Mar. 2, 2023

(51) Int. Cl.
*H01L 23/053* (2006.01)
*H01L 23/10* (2006.01)

(52) U.S. Cl.
CPC ............ *H01L 23/053* (2013.01); *H01L 23/10* (2013.01)

(58) Field of Classification Search
CPC ....... H01L 23/053; H01L 23/10; H01L 23/04; H01L 23/16; H01L 23/3675
USPC ........................................................ 257/690
See application file for complete search history.

(56) References Cited

U.S. PATENT DOCUMENTS

| | | | |
|---|---|---|---|
| 5,881,945 A | 3/1999 | Edwards et al. | |
| 6,437,436 B2 | 8/2002 | Wang et al. | |
| 6,486,562 B1 * | 11/2002 | Kato | H01L 23/4334 257/796 |
| 7,168,484 B2 | 1/2007 | Zhang et al. | |
| 7,440,281 B2 | 10/2008 | Bailey et al. | |
| 7,585,702 B1 | 9/2009 | Wang et al. | |
| 7,704,798 B2 | 4/2010 | Hua et al. | |
| 7,728,440 B2 | 6/2010 | Honda | |
| 8,063,482 B2 | 11/2011 | Lu | |
| 8,299,633 B2 | 10/2012 | Su | |
| 10,043,730 B2 * | 8/2018 | Refai-Ahmed | H01L 24/72 |
| 10,163,754 B2 * | 12/2018 | Ho | H01L 23/3675 |
| 10,643,924 B1 | 5/2020 | Shen | |
| 10,685,920 B2 | 6/2020 | Yew et al. | |
| 10,910,790 B2 | 2/2021 | Kim et al. | |
| 11,646,302 B2 | 5/2023 | Chen et al. | |
| 11,749,631 B2 | 9/2023 | Chen et al. | |
| 2001/0023533 A1 | 9/2001 | Sylvester | |

(Continued)

FOREIGN PATENT DOCUMENTS

| | | |
|---|---|---|
| JP | 2010-103338 A | 5/2010 |
| TW | 200618214 A | 6/2006 |

(Continued)

OTHER PUBLICATIONS

PCT/US2022/074965, "PCT Notification of Transmittal of the International Search Report and the Written Opinion of the International Searching Authority, or the Declaration", mailed Dec. 7, 2022, 11 pages.

*Primary Examiner* — Jaehwan Oh
*Assistant Examiner* — John M Parker
(74) *Attorney, Agent, or Firm* — Aikin & Gallant, LLP (57) ABSTRACT

Modules and methods of assembly are described. A module includes a lid mounted on a module substrate and covering a component. A stiffener structure may optionally be mounted between the lid and module substrate. A recess can be formed in any of an outer wall bottom surface of the lid, and top or bottom surface of the stiffener structure such that an adhesive layer at least partially fills the recess.

18 Claims, 7 Drawing Sheets

(56) References Cited

U.S. PATENT DOCUMENTS

| | | |
|---|---|---|
| 2003/0230800 A1 | 12/2003 | Akai |
| 2004/0238827 A1 | 12/2004 | Takayama et al. |
| 2005/0127502 A1 | 6/2005 | Lee et al. |
| 2005/0184404 A1 | 8/2005 | Huang et al. |
| 2006/0076648 A1 | 4/2006 | Gally et al. |
| 2008/0203558 A1 | 8/2008 | Tashiro et al. |
| 2010/0096747 A1 | 4/2010 | Kusano |
| 2011/0149537 A1 | 6/2011 | Kurosawa |
| 2012/0007229 A1 | 1/2012 | Bartley et al. |
| 2012/0182694 A1 | 7/2012 | Lin et al. |
| 2012/0241944 A1 | 9/2012 | Beaumier et al. |
| 2013/0001740 A1 | 1/2013 | Ma |
| 2013/0242496 A1 | 9/2013 | Ahmad et al. |
| 2014/0061893 A1 | 3/2014 | Saeidi et al. |
| 2014/0091461 A1 | 4/2014 | Shen |
| 2014/0331777 A1* | 11/2014 | Tomita .................... G01L 9/06 73/754 |
| 2015/0001701 A1 | 1/2015 | Li et al. |
| 2015/0021754 A1 | 1/2015 | Lin et al. |
| 2015/0155221 A1 | 6/2015 | Chen et al. |
| 2015/0162307 A1 | 6/2015 | Chen et al. |
| 2015/0179607 A1 | 6/2015 | Ho et al. |
| 2015/0187679 A1 | 7/2015 | Ho et al. |
| 2015/0206851 A1 | 7/2015 | De Sousa et al. |
| 2015/0357258 A1 | 12/2015 | Fitzgerald et al. |
| 2016/0035637 A1 | 2/2016 | Urago et al. |
| 2017/0092619 A1* | 3/2017 | Refai-Ahmed ......... H01L 23/04 |
| 2017/0372979 A1 | 12/2017 | Gandhi |
| 2018/0068916 A1 | 3/2018 | Iruvanti et al. |
| 2018/0350712 A1 | 12/2018 | Thanu et al. |
| 2019/0327859 A1 | 10/2019 | Iyengar et al. |
| 2020/0194335 A1 | 6/2020 | Eid et al. |
| 2020/0402882 A1* | 12/2020 | Kim ..................... H01L 23/055 |
| 2021/0118756 A1 | 4/2021 | Wan et al. |
| 2021/0233949 A1 | 7/2021 | Chino et al. |
| 2021/0305227 A1 | 9/2021 | Chen et al. |
| 2021/0366861 A1 | 11/2021 | Chen et al. |

FOREIGN PATENT DOCUMENTS

| | | |
|---|---|---|
| TW | 200631140 A | 9/2006 |
| WO | 2019005154 A1 | 1/2019 |
| WO | 2019066993 A1 | 4/2019 |

\* cited by examiner

RECESSED LID AND RING DESIGNS AND LID LOCAL PERIPHERAL REINFORCEMENT DESIGNS

BACKGROUND

Field

Embodiments described herein relate to multiple chip modules, and in particular to lids thereof.

Background Information

Lids are widely used in multiple chip modules (MCMs) for a variety of reasons, such as to provide mechanical integrity, hermetic sealing from environment, and thermal performance. In an exemplary implementation one or more components are surface mounted onto a module substrate, and then optionally underfilled. A lid is then secured onto the module substrate and over the component(s).

SUMMARY

Embodiments describe multiple chip module (MCM) structures in which recessed lid and/or stiffener structure designs are assembled to obtain the mechanical integrity and thermal benefits of a lid, while mitigating stress at the bonding interfaces and protecting integrity of the MCM. In some embodiments, the lid may include a plurality of local peripheral reinforcement structures that extend laterally adjacent to the stiffener structure to provide additional mechanical integrity while assisting alignment.

DETAILED DESCRIPTION

While lids can provide mechanical integrity to an MCM, it has been observed that lids can also induce large stress and high warpage in an MCM and induce mechanical failures. For example, lids formed of copper may have a comparatively high coefficient of thermal expansion (CTE) relative to other module features. This can result in thermal expansion and induce stress and warpage in the MCM components (e.g. packages) when the lid is strongly coupled with the rest of the module. The large stress at the interface (e.g. lid and substrate interface, lid and stiffener interface, etc.) may cause delamination of the bonding material used (e.g. adhesive) or bulk cracking of the bonding material. CTE mismatch between low CTE stiffeners and the rest of the MCM components can cause high stress and mechanical failure as well. In accordance with embodiments, various combinations of lids and stiffener structures (also referred to as stiffener rings) are provided to reduce stresses in the bonding locations and hence protect integrity of the MCM.

Figure 1A:
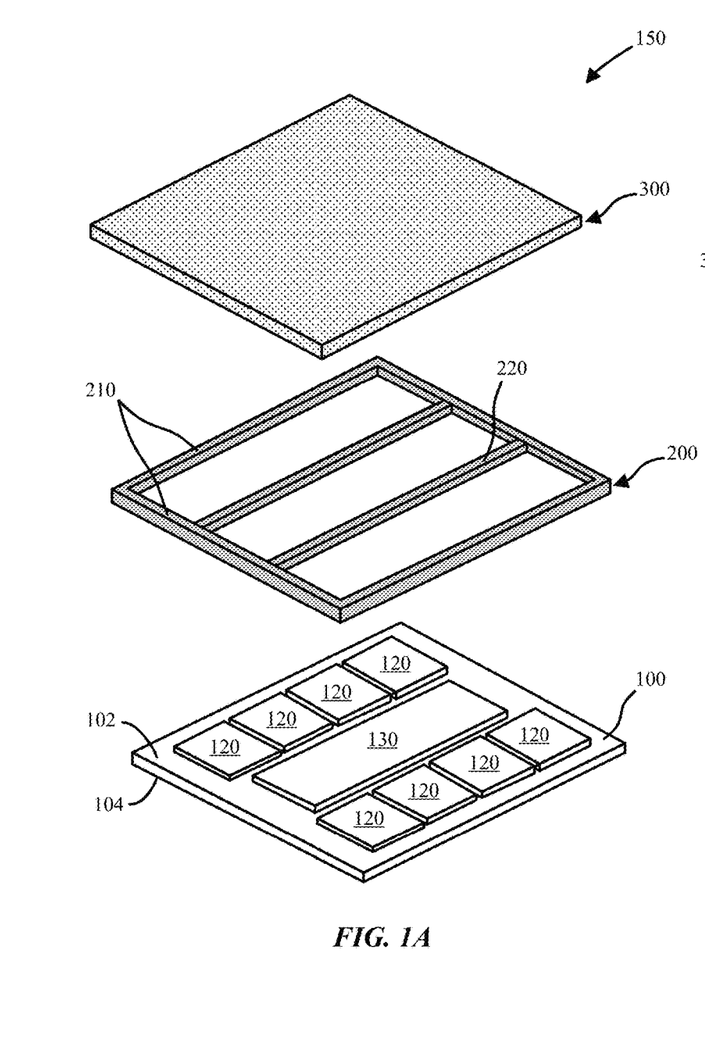
FIG. 1A is an exploded isometric view illustration of a module including a lid and stiffener structure with inner and outer support structures in accordance with an embodiment.
Figure 1B:
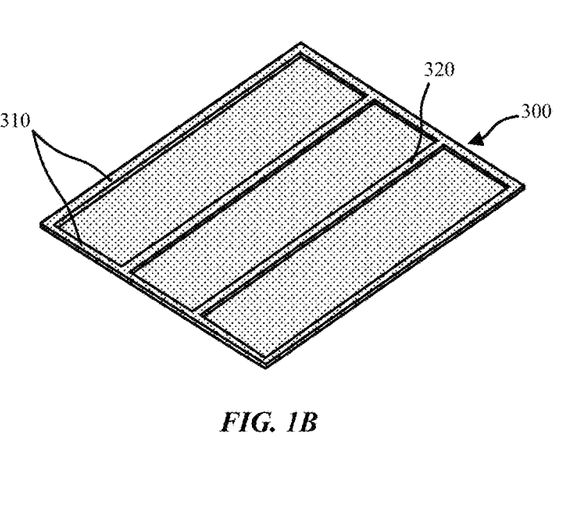
FIG. 1B is an isometric bottom view illustration of a lid with inner and outer walls in accordance with an embodiment.

Referring now to FIG. 1A an exploded isometric view illustration is provided of a module 150 (e.g. MCM) including a lid 300 and stiffener structure 200 with inner support structures 220 and outer support structures 210. FIG. 1B is an isometric bottom view illustration of a lid 300 with inner walls 320 and outer walls 310 in accordance with an embodiment. In the illustrated embodiment the inner walls 320 can align with the inner support structures 220, while the outer walls 310 can align with the outer support structures 210.

In the exemplary embodiment, the module 150 includes a module substrate 100 including a top side 102 and bottom side 104. A plurality of first components 120 can be mounted on the top side 102 of the module substrate 100. First components 120 may be active or passive devices, and may be chips or packages. For example, first components 120 may be memory packages, such as dynamic random-access memory (DRAM) including one or more dies, which can be stacked dies, or side-by-side. In an embodiment, first components are chip scale packages. First components 120 can additionally be different types of components, and need not be identical. One or more second components 130 can also be mounted on the top side 102 of the module substrate 100. In an embodiment, a second component 130 is a package that includes a plurality (e.g. two or more) of side-by-side dies. For example, second component 130 may include a plurality of side-by-side logic, or system on chip dies.

Figure 2A:
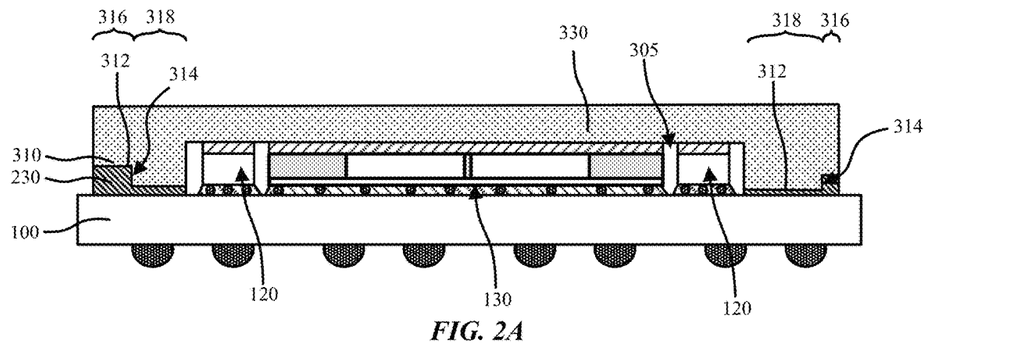
FIGS. 2A-2C are schematic cross-sectional side view illustrations of lid designs with recessed outer walls in accordance with embodiments.
Figure 2B:
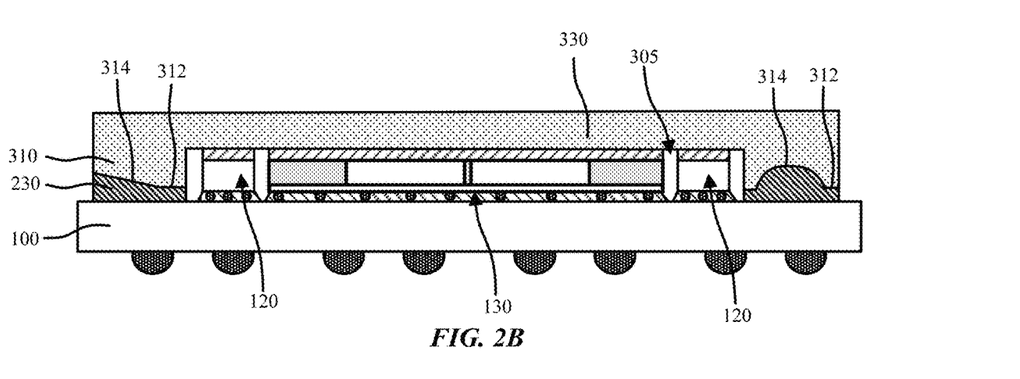
Figure 2C:
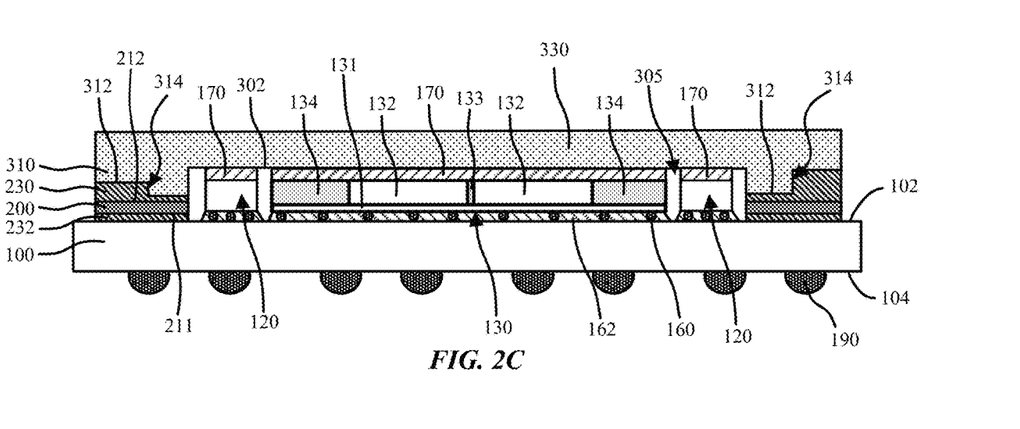

Referring now to FIGS. 2A-2C schematic cross-sectional side view illustrations are provided of lid 300 designs with recessed outer walls 310 in accordance with embodiments. It is to be appreciated that while only outer walls 310 are illustrated, the recessed wall structures in accordance with embodiments can also, or alternatively, be used with the optional inner walls. In an exemplary implementation, first components 120 and second component 130 are surface mounted onto the module substrate 100 using any suitable technique such as solder bumps 160, with optional underfill 162 (e.g. epoxy). In the illustrated embodiment, the second component 130 is a package that includes a plurality of side-by-side dies 132 on a package substrate 131 and encapsulated in a molding compound 134. As shown, the space 133 laterally between the dies 132 may be filled with molding compound 134. It has been observed this can be a high stress location within the MCM due to close proximity of a variety of materials and MCM structures.

A thermal interface material (TIM) 170 can be located on top sides of the first components 120 and second component 130 in order to secure to the lid 300. TIM 170 may be applied using any suitable technique such as dispensing or tape. Exemplary TIM 170 materials include, but are not limited to, thermal grease, solder, metal filled polymer matrix, etc.

In accordance with embodiments the lid 300 can be bonded to an intermediate stiffener structure 200 (also referred to as a stiffener ring), which in turn is bonded to the module substrate 100. The stiffener structure 200 and lid 300 can be bonded using adhesive layers 230, 232. Exemplary adhesive materials include glass paste, epoxies, urethane, polyurethane, silicone elastomers, etc. The lid 300 can similarly be bonded to the stiffener structure 200 after mounting the stiffener structure on the module substrate 100, or before.

The lid 300 may include a roof 330, outer (periphery) walls 310 and optionally inner walls 320. The bottom surface 302 of the roof may be bonded to the TIM 170 on top of the second component 130 and first components 120. Contour of the bottom surface 302 (thickness of the roof 330) can be adjusted to evenly mate with the TIM 170 for the various first components 120 and second component 130. The outer walls 310 and optional inner walls 320 can extend from the roof 330 (e.g. protrude from the bottom surface) to form one or more cavities 305 which accommodate the second component 130 and first components 120. In accordance with embodiments, the stiffener structure 200 is shaped to mate with the outer walls 310 and optional inner walls 320 of the lid 300. Specifically, the stiffener structure 200 can include outer support structure (walls) 210 and optional inner support structure 220 (walls). Outer support structure 210 and inner support structure 220 may be integrally formed of the same material. Alternatively, outer support structure 210 and inner support structure 220 can be formed of different materials with different CTE. A variety of additional configurations, with different materials are possible. The mating surfaces between the stiffener structure 200 and lid 300 may have a same surface area. A plurality of module solder bumps 190 may optionally be applied to the bottom side 104 of the module substrate 100 for further integration.

In accordance with embodiments, various combinations of lids and stiffener structures are provided to balance the ability of the lid to provide mechanical integrity to the module while not inducing mechanical failure. In particular, various combinations of recessed lid and stiffener structure designs are described. Furthermore, lids with local perimeter reinforcements are described to provide additional mechanical integrity while assisting alignment.

In an embodiment a module 150 includes a module substrate 100, a component (e.g. first component 120, second component 130, etc.) on a top side 102 of the module substrate, and a lid 300 mounted on the module substrate and covering the component. The lid may include an outer wall 310 that includes a lid recess 314 in a bottom surface 312 of the outer wall 310. As shown in FIGS. 2A-3C, a first adhesive layer 230 can at least partially fill the lid recess 314 in the bottom surface 312 of the outer wall 310. Such a recessed lid design may allow for a localized thickness increase of the first adhesive layer 230 so that stresses can be reduced.

Referring to the embodiments illustrated in FIGS. 2A-2B, the first adhesive layer 230 may be bonded to both the bottom surface 312 of the outer wall 310 and to the top side 102 of the module substrate. The lid recesses 314 may be formed along different regions of the outer wall 310. For example, in the embodiment illustrated in FIG. 2A the lid recess 314 is along an outer portion 316 (exterior portion) of the outer wall. Thus, the outer wall 310 may be thicker along an inner portion 318 than an outer portion 316. Alternatively, the lid recess 314 can be along the inner portion 318 rather than the outer portion 316. Width of the lid recesses 314 can be varied within a lid 300 as shown in FIG. 2A, for specific stress control for example.

In the embodiment illustrated in FIG. 2A, the lid recess 314 is in the form of a step, which may have a vertical sidewall or tapered sidewall. The lid recess 314 may also be sloped or curved, as shown in FIG. 2B.

In accordance with embodiment the lid 300 walls can align with the module substrate 100 or stiffener structures. For example, an outer wall 310 bottommost bottom surface 312 may be flat to mate with a flat top side 102 of the module substrate 100. Inclusion of the lid recesses 314 can reduce flat-on-flat surface area and potentially delamination caused by thermal stresses. Some amount of flat-on-flat surface stacking however can aid with stability.

In some embodiments a stiffener structure 200 is stacked between the lid 300 and the module substrate 100. For example, the stiffener structure 200 can be formed of a lower CTE material than the lid to reduce stress and warpage of the MCM. In an exemplary implementation a low CTE stiffener material can be a nickel-iron alloy (FeNi36), iron-nickel-cobalt alloy (sold under the trademark KOVAR, trademark of CRS Holdings, Inc., Delaware), iron-nickel alloy (Alloy42), stainless steels (SUS410, SUS430), etc. while the lid is formed of a higher CTE material such as copper.

Referring now to the embodiment illustrated in FIG. 2C, a stiffener structure 200 can be mounted on the top side 102 of the module substrate 100. Specifically, the top surface of outer support structure 210 of the stiffener structure 200 can be bonded to the bottom surface 312 of the outer wall 310 with the first adhesive layer 230. A second adhesive layer 232 can be used to bond a bottom surface of the stiffener structure 200 to the top side 102 of the module substrate 100. In the particular embodiment illustrated, the bottom surface 211 and top surface 212 of the stiffener structure 200 (our outer support structure 210) are flat. However, this is not required, and the stiffener structure 200 top and/or bottom surfaces can include stiffener recesses, such as stepped, sloped or curved recesses. The top surface 212 of the stiffener structure can also have a contour that mates with and is opposite of a contour for the bottom surface 312 of the outer wall 310.

Figure 3A:
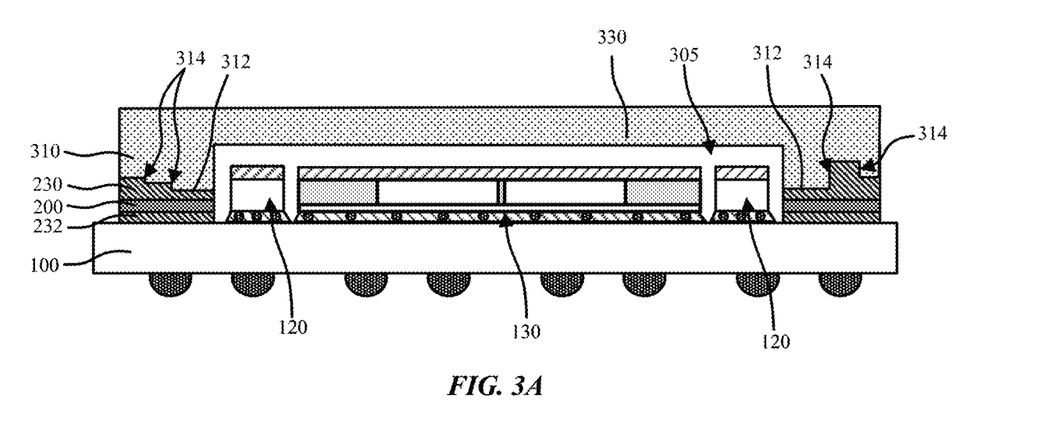
FIGS. 3A-3B are schematic cross-sectional side view illustrations of lid designs with step recessed outer walls in accordance with embodiments.
Figure 3B:
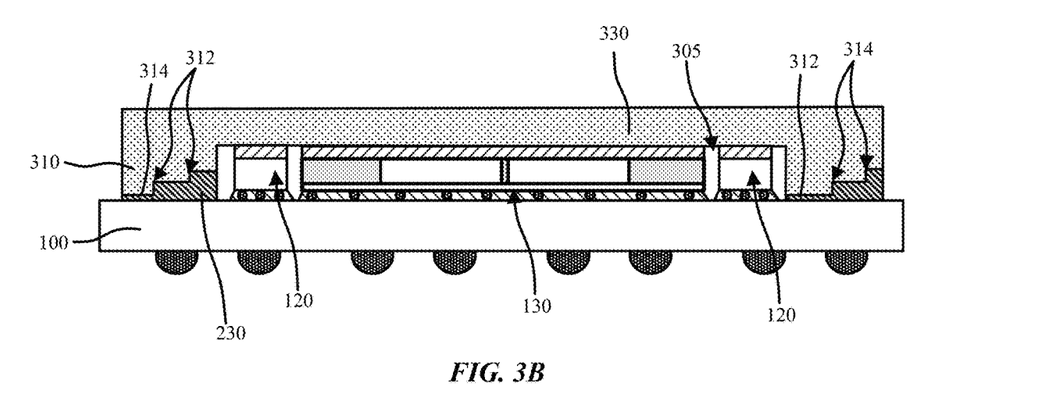

In some embodiments, the outer wall 310 includes a stepped lid recess 314. For example, in the embodiments illustrated in FIGS. 2A and 2C, the lid recess 314 includes a single step. The lid recess 314 may include a plurality of steps as illustrated in FIGS. 3A-3B. As shown, the steps can proceed as a staircase with continuous increase or decrease in thickness of the outer wall 310 from exterior side to interior side of the lid 300. The steps can also be variable, such that a larger recess volume in a center portion of the outer wall 310.

Referring now to FIGS. 4A-4D, schematic cross-sectional side view illustrations are provided of recessed stiffener structure 200 designs in accordance with embodiments. Similar to the recessed lid designs, the stiffener structure 200 can alternatively be recessed, or recessed in combination with the lid 300. In an embodiment, a module 150 includes a module substrate 100, a component (first component 120 and/or second component 130) on a top side 102 of the module substrate, a stiffener structure 200 mounted on the top side 102 of the module substrate, and a lid 300 mounted on the stiffener structure 200 and covering the component. A first adhesive layer 230 can be used to bond the top surface 212 of the stiffener structure 200 to the lid 300, and a second adhesive layer 232 can be used to bond the bottom surface 211 of the stiffener structure 200 to the module substrate 100. In accordance with embodiments, a stiffener recess 214 is formed in either, or both, of the top surface 212 and bottom surface 211 of the stiffener structure 200.

The stiffener recesses 214 may be formed along different regions of the stiffener structure 200 (e.g. within outer support structure 210 and inner support structure 220). For example, in the embodiment illustrated in FIG. 4A the stiffener recess 214 is along an outer portion 216 (exterior portion) of the outer support structure. Thus, the outer support structure 210 may be thicker along an inner portion 218 than an outer portion 216. Alternatively, the stiffener recess 214 can be along the inner portion 218 rather than the outer portion 216. Width of the stiffener recesses 214 can be varied within a stiffener structure 200 as shown in FIG. 2A, for specific stress control for example.

Figure 4A:
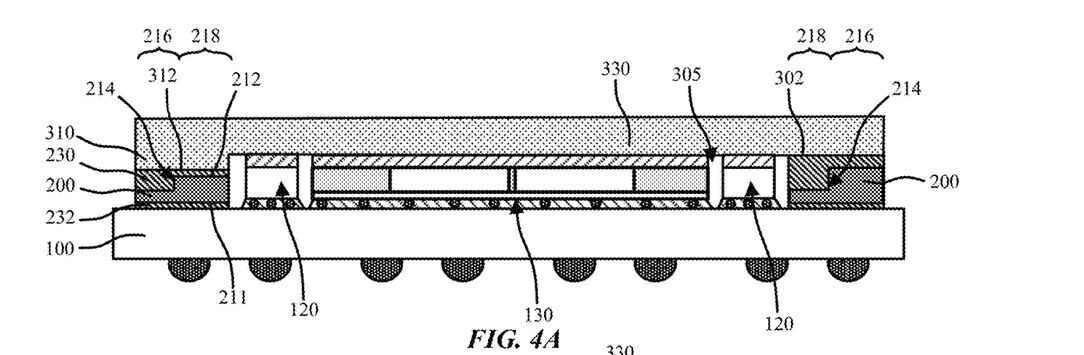
FIGS. 4A-4D are schematic cross-sectional side view illustrations of recessed stiffener structure designs in accordance with embodiments.
Figure 4B:
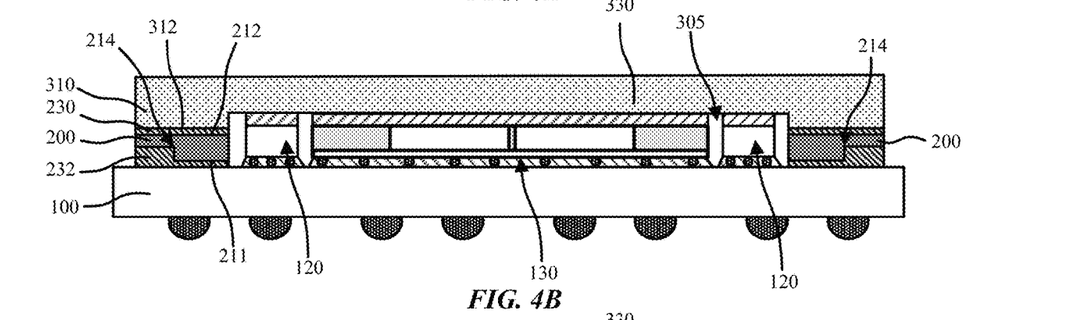
Figure 4C:
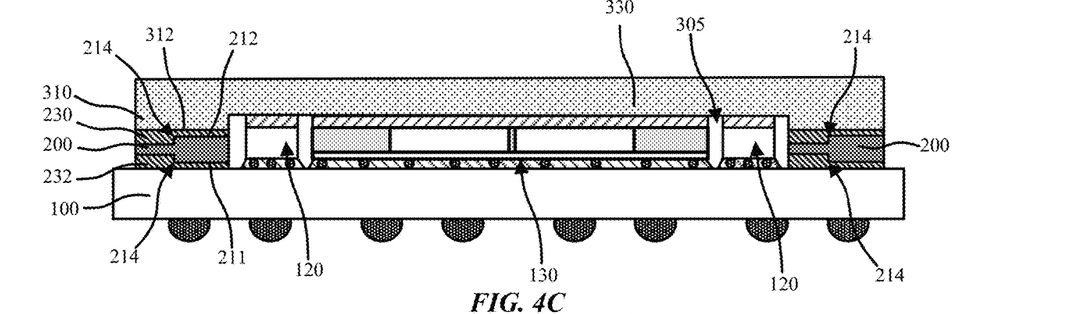
Figure 4D:
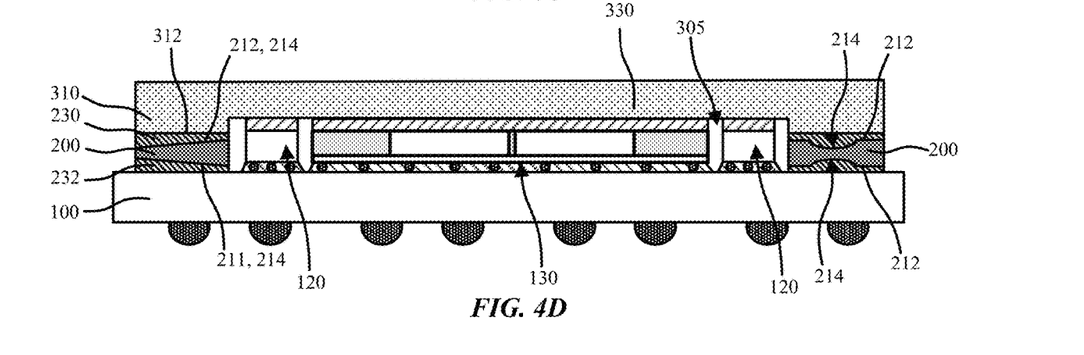

In the embodiment illustrated in FIGS. 4A-4C, the stiffener recess 214 is in the form of a step, which may have a vertical sidewall or tapered sidewall. The stiffener recess 214 may also be sloped or curved, as shown in FIG. 4D.

In accordance with embodiment the stiffener structure can align with the module substrate 100 and lid 300. For example, a bottommost bottom surface 211 may be flat to mate with a flat top side 102 of the module substrate 100. A topmost top surface 212 may be flat to mate with a flat bottom surface 312 of the lid 300. Inclusion of the stiffener recesses 214 can reduce flat-on-flat surface area and potentially delamination caused by thermal stresses. Some amount of flat-on-flat surface stacking however can aid with stability.

Figure 5A:
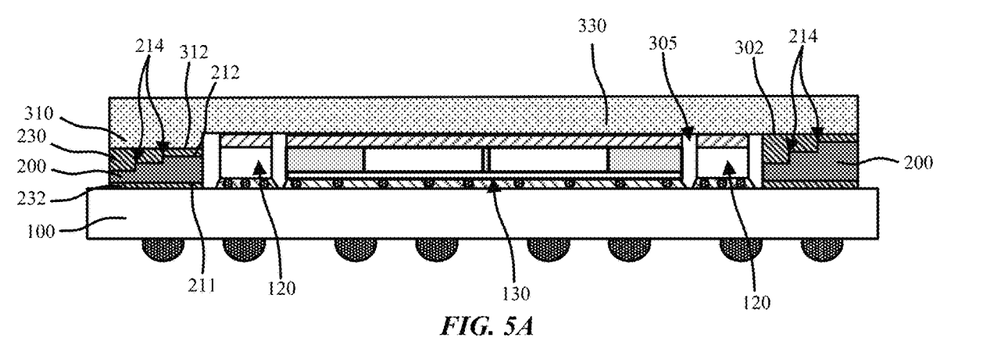
FIGS. 5A-5C are schematic cross-sectional side view illustrations of step recessed stiffener structure designs in accordance with embodiments.
Figure 5B:
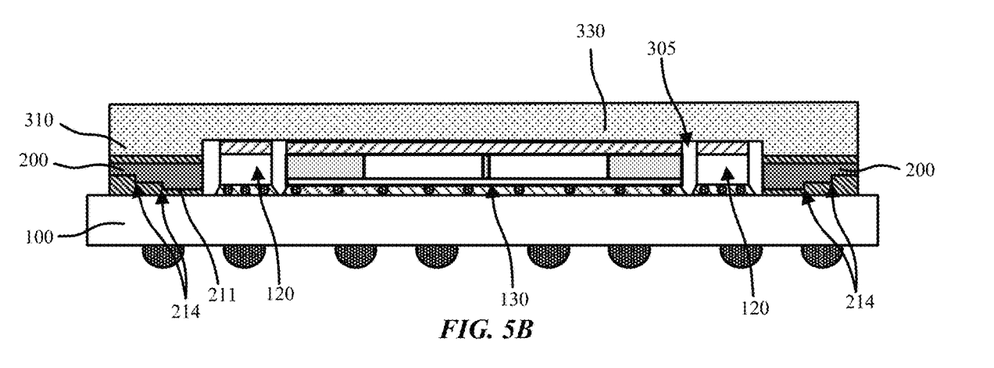
Figure 5C:
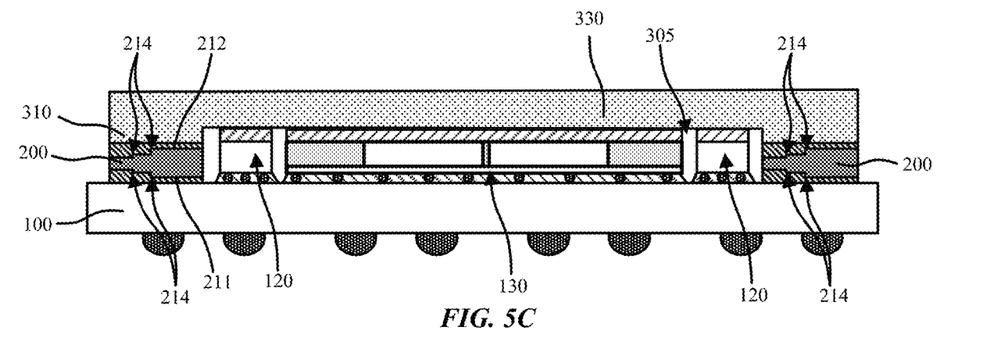

In some embodiments, the stiffener structure 200 includes a stepped stiffener recess 214. For example, in the embodiments illustrated in FIGS. 4A-4C, the lid recess 314 includes a single step. The lid recess 314 may include a plurality of steps on one or both sides as illustrated in FIGS. 5A-5C. As shown, the steps can proceed as a staircase with continuous increase or decrease in thickness of the stiffener structure 200 from exterior side to interior side of the stiffener structure 200. The steps can also be variable, such that a larger recess volume in a center portion of the stiffener structure 200.

Referring again briefly o FIGS. 4A and 5A, the lids 300 in accordance with embodiments when used with stiffener structures 200 may or may not include inner and outer walls. As shown, the stiffener structures 200 can be bonded to the bottom surfaces of the outer walls 310, as well as inner walls, or to the bottom surface 302 of roof 330.

Up until this point, various combinations of recessed lids and stiffener have been described to balance the ability of the lid to provide mechanical integrity to the module while not inducing mechanical failure. In order to further facilitate alignment of the lids 300 and stiffener structures 200, local peripheral reinforcement structures (or local caps) can be included on the lids 300 to provide additional mechanical integrity while assisting alignment.

Figure 6A:
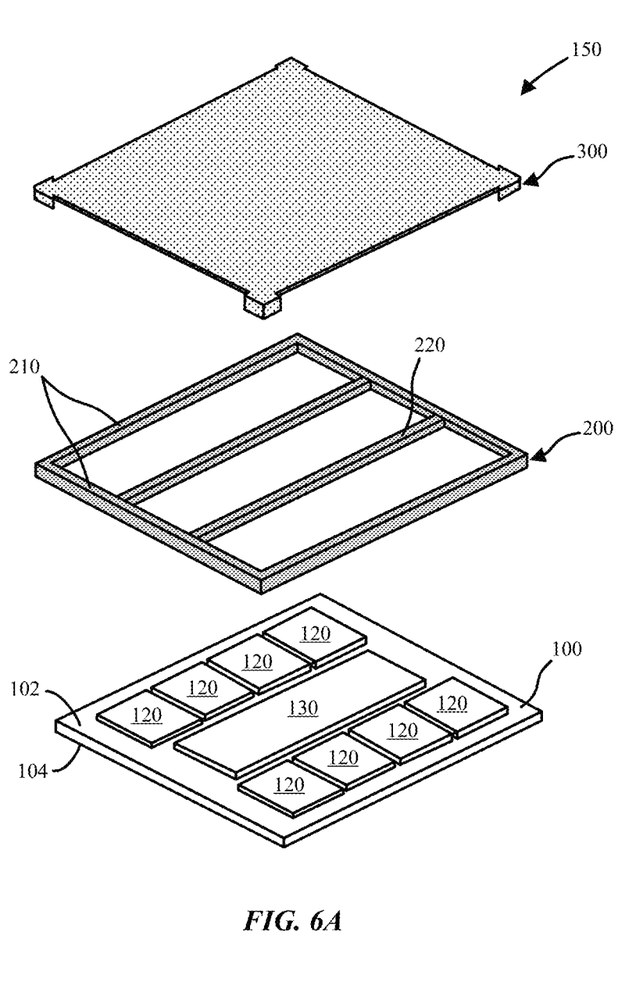
FIG. 6A is an exploded isometric top view illustration of a module including a lid with overhanging local peripheral reinforcement structures in accordance with an embodiment.
Figure 6B:
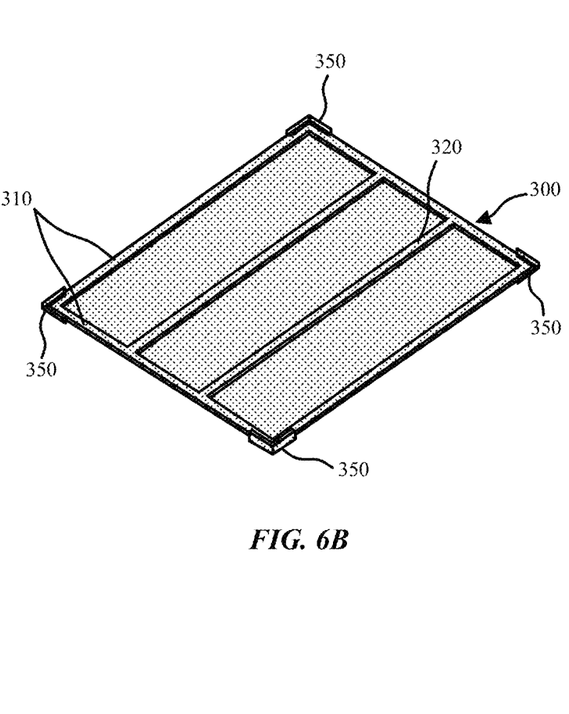
FIG. 6B is an isometric bottom view illustration of a lid with overhanging local peripheral reinforcement structures in accordance with an embodiment.

Referring now to FIGS. 6A-6B, FIG. 6A is an exploded isometric top view illustration of a module 150 including a lid 300 with overhanging local peripheral reinforcement structures 350 in accordance with an embodiment; FIG. 6B is an isometric bottom view illustration of a lid 300 with overhanging local peripheral reinforcement structures 350 in accordance with an embodiment. FIGS. 6A-6B are substantially similar to FIGS. 1A-1B with addition of the local peripheral reinforcement structures 350. In accordance with embodiments, the lid 300 can be mounted onto the module substrate 100, optionally with an intermediate stiffener structure 200 therebetween. In such embodiments, the lid 300 and/or optional stiffener structure 200 can include any combination of the various recess designs described herein. Furthermore, embodiments envision modules 150 including a lid with local peripheral reinforcement structures 350 without combination with the various recess designs described herein.

In an embodiment, a module 150 includes a module substrate 100, a component on a top side 102 of the module substrate, a stiffener structure 200 mounted on the top side 102 of the module substrate 100, and a lid 300 mounted on the stiffener structure 200 and covering the component. In an embodiment, the lid 300 includes a plurality of local peripheral reinforcement structures 350 extending laterally adjacent to the stiffener structure 200. In the particular embodiment illustrated in FIGS. 6A-6B, the local peripheral reinforcement structures 350 are located at corners of the lid 300. However, the local peripheral reinforcement structures 350 can formed at other locations, such as along side edges of the lid 300. In both configurations, the locations and closeness to the side edges of the stiffener structure 200 can mitigate x-y shift of the lid 300 and facilitate integrity of the adhesive bonds.

Figure 7A:
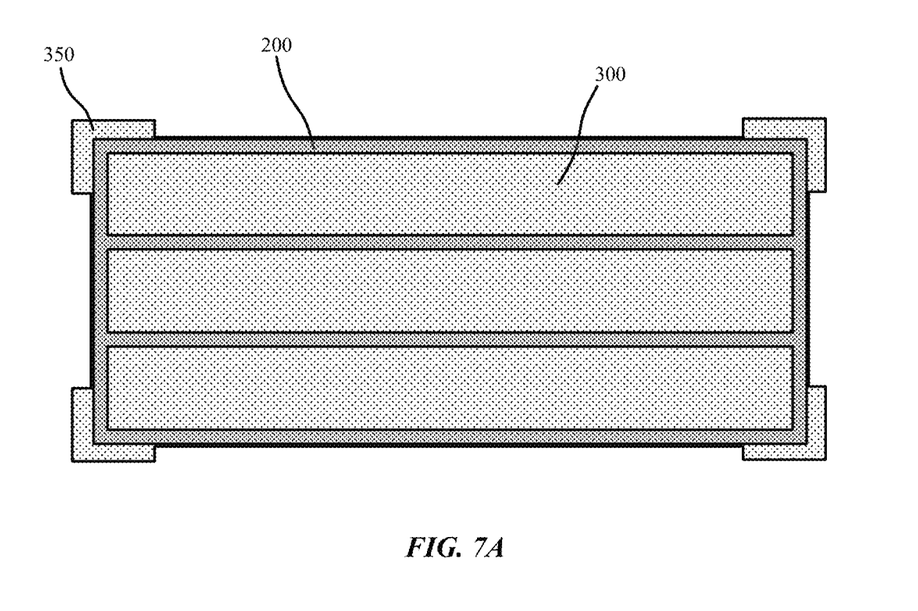
FIG. 7A is a schematic bottom view illustration of a lid with overhanging local peripheral reinforcement structures arranged over a stiffener structure in accordance with an embodiment.
Figure 7B:
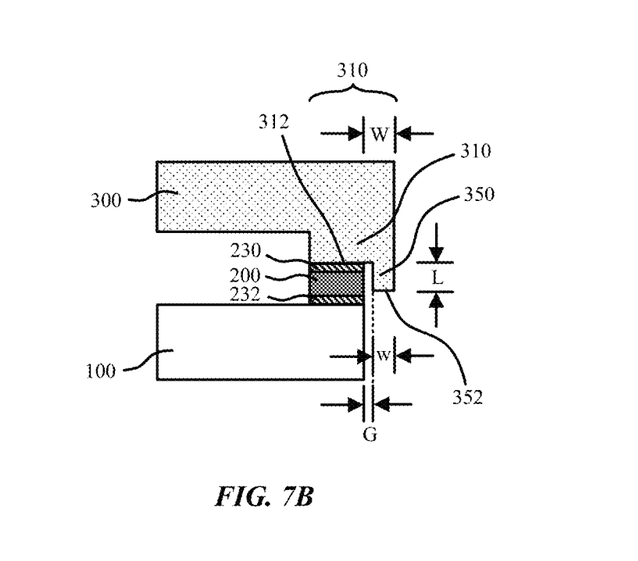
FIG. 7B is a close-up schematic cross-sectional side view illustration of a lid with overhanging local peripheral reinforcement structure arranged over a stiffener structure in accordance with an embodiment.

Referring now to FIGS. 7A-7B, FIG. 7A is a schematic bottom view illustration of a lid 300 with overhanging local peripheral reinforcement structures 350 arranged over a stiffener structure 200 in accordance with an embodiment; FIG. 7B is a close-up schematic cross-sectional side view illustration of a lid 300 with overhanging local peripheral reinforcement structure 350 arranged over a stiffener structure 200 in accordance with an embodiment. In an embodiment, the local peripheral reinforcement structures 350 extend from an outer wall 310 of the lid 300. More specifically, the local peripheral reinforcement structures 350 are formed by an additional width (W) of the lid 300, and protrude from a bottommost bottom surface 312 of the outer wall 310 which rests on the reinforcement structure 200. The local reinforcement structures 350 may be in the form of a hanging lip of length (L), including a width (w) an inner surface that is spaced apart from the reinforcement structure 200 by a gap (G). The length (L) may be a distance between the bottom surface 312 of the outer wall 310 and a bottom surface 352 of the lip. The gap (G) distance may be designed to balance alignment and processability. In some embodiments, the length (L) of the local reinforcement structure 350 can extend laterally adjacent to a side edge of the module substrate 100. Such a configuration can be achieved both with and without the stiffener structure 200.

In utilizing the various aspects of the embodiments, it would become apparent to one skilled in the art that combinations or variations of the above embodiments are possible for forming module with recessed lid and/or ring designs and lid with local peripheral reinforcement structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A module comprising:
   a module substrate;
   a component on a top side of the module substrate;
   a stiffener structure mounted on the top side of the module substrate, the stiffener including a flat top surface; and
   a lid mounted on the flat top surface of the stiffener structure and covering the component, wherein the lid comprises a bottom surface and a lid recess in the bottom surface,
   wherein the stiffener structure flat top surface is bonded to the bottom surface of the lid with a first adhesive layer that at least partially fills the lid recess in the bottom surface of the lid.

2. The module of claim 1, wherein the lid recess is along an outer portion of an outer wall of the lid.

3. The module of claim 1, wherein the lid recess is along an inner portion of an outer wall of the lid.

4. The module of claim 1, wherein the lid recess includes a plurality of steps.

5. The module of claim 1, wherein the lid recess is sloped or curved.

6. The module of claim 1, further comprising a second adhesive layer bonding the stiffener structure to the top side of the module substrate.

7. The module of claim 1, wherein the stiffener structure is formed of a material with lower coefficient of thermal expansion (CTE) than the lid.

8. The module of claim 1, wherein the lid includes a plurality of local peripheral reinforcement structures extending laterally adjacent to the stiffener structure.

9. The module of claim 8, wherein the plurality of local peripheral reinforcement structures is located at corners of the lid.

10. The module of claim 8, wherein the plurality of local peripheral reinforcement structures is located along side edges of the lid.

11. A module comprising:
    a module substrate;
    a component on a top side of the module substrate;
    a stiffener structure mounted on a flat surface of the top side of the module substrate;
    a lid mounted on the stiffener structure and covering the component;
    a first adhesive layer bonding a top surface of the stiffener structure to the lid;
    a second adhesive layer bonding a bottom surface of the stiffener structure to the module substrate; and
    a first stiffener recess formed in the bottom surface of the stiffener structure;
    wherein the second adhesive layer at least partially fills the first stiffener recess.

12. The module of claim 11, further comprising a second stiffener recess formed in a top surface of the stiffener structure.

13. The module of claim 11, wherein the first stiffener recess includes a plurality of steps.

14. The module of claim 11, wherein the first stiffener recess is sloped or curved.

15. The module of claim 11, wherein the lid includes a plurality of local peripheral reinforcement structures extending laterally adjacent to and outside of a lateral periphery of the stiffener structure.

16. A module comprising:
    a module substrate;
    a component on a top side of the module substrate;
    a stiffener structure mounted on the top side of the module substrate; and
    a lid mounted on the stiffener structure and covering the component;
    wherein the lid includes a plurality of local peripheral reinforcement structures extending laterally adjacent to and outside of a lateral periphery of the stiffener structure.

17. The module of claim 16, wherein the plurality of local peripheral reinforcement structures is located at corners of the lid.

18. The module of claim 17, wherein the plurality of local peripheral reinforcement structures is located along side edges of the lid.

* * * * *